United States Patent
Fish et al.

(10) Patent No.: US 11,573,123 B2
(45) Date of Patent: Feb. 7, 2023

(54) HETEROGENEOUS SPECTROSCOPIC TRANSCEIVING PHOTONIC INTEGRATED CIRCUIT SENSOR

(71) Applicant: OpenLight Photonics, Inc., Goleta, CA (US)

(72) Inventors: Gregory Alan Fish, Santa Barbara, CA (US); Jonathan Edgar Roth, San Francisco, CA (US); Brandon Buckley, Santa Barbara, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 0 days.

(21) Appl. No.: 17/554,291

(22) Filed: Dec. 17, 2021

(65) Prior Publication Data

US 2022/0107219 A1 Apr. 7, 2022

Related U.S. Application Data

(63) Continuation of application No. 16/927,290, filed on Jul. 13, 2020, now Pat. No. 11,231,320, which is a (Continued)

(51) Int. Cl.
*G01J 3/02* (2006.01)
*G01J 3/18* (2006.01)
(Continued)

(52) U.S. Cl.
CPC .............. *G01J 3/1895* (2013.01); *G01J 3/021* (2013.01); *G01J 3/0205* (2013.01);
(Continued)

(58) Field of Classification Search
CPC ........ G01J 3/02; G01J 3/18; G01J 3/10; G01J 3/28; H01S 5/40; H01S 5/02; H01S 5/026;
(Continued)

(56) References Cited

U.S. PATENT DOCUMENTS 5,870,512 A 2/1999 Koch et al.
6,324,204 B1 11/2001 Deacon
(Continued)

FOREIGN PATENT DOCUMENTS

EP 3002568 A1 4/2016
EP 3002568 B1 11/2019
WO WO-2013109978 A1 7/2013

OTHER PUBLICATIONS

"U.S. Appl. No. 14/865,318, Non-Final Office Action dated Jun. 9, 2017", 10 pgs.
(Continued)

*Primary Examiner* — Abdullahi Nur
(74) *Attorney, Agent, or Firm* — Schwegman Lundberg & Woessner, P.A.

(57) ABSTRACT

Described herein are optical sensing devices for photonic integrated circuits (PICs). A PIC may comprise a plurality of waveguides formed in a silicon on insulator (SOI) substrate, and a plurality of heterogeneous lasers, each laser formed from a silicon material of the SOI substrate and to emit an output wavelength comprising an infrared wavelength. Each of these lasers may comprise a resonant cavity included in one of the plurality of waveguides, and a gain material comprising a non-silicon material and adiabatically coupled to the respective waveguide. A light directing element may direct outputs of the plurality of heterogeneous lasers from the PIC towards an object, and one or more detectors may detect light from the plurality of heterogeneous lasers reflected from or transmitted through the object.

20 Claims, 8 Drawing Sheets

Related U.S. Application Data continuation of application No. 16/545,362, filed on Aug. 20, 2019, now Pat. No. 10,732,039, which is a continuation of application No. 16/162,489, filed on Oct. 17, 2018, now Pat. No. 10,422,693, which is a continuation of application No. 15/723,409, filed on Oct. 3, 2017, now Pat. No. 10,139,278, which is a continuation of application No. 14/865,318, filed on Sep. 25, 2015, now Pat. No. 9,804,027.

(60) Provisional application No. 62/056,765, filed on Sep. 29, 2014.

(51) Int. Cl.

| G02B 6/12 | (2006.01) |
|---|---|
| G02B 6/42 | (2006.01) |
| G02B 6/34 | (2006.01) |
| G02F 1/025 | (2006.01) |
| H01S 5/40 | (2006.01) |
| G01J 3/10 | (2006.01) |
| H01S 5/02 | (2006.01) |
| H01S 5/026 | (2006.01) |

(52) U.S. Cl.
CPC ............. *G01J 3/0259* (2013.01); *G01J 3/108* (2013.01); *G02B 6/12004* (2013.01); *G02B 6/34* (2013.01); *G02B 6/4214* (2013.01); *G02F 1/025* (2013.01); *H01S 5/4075* (2013.01); *H01S 5/4087* (2013.01); *G01J 2003/102* (2013.01); *G01J 2003/104* (2013.01); *H01S 5/021* (2013.01); *H01S 5/026* (2013.01)

(58) Field of Classification Search
CPC .... G02B 6/42; G02B 6/12; G02B 6/34; G01F 1/02
See application file for complete search history.

(56) References Cited

U.S. PATENT DOCUMENTS

| 7,809,041 | B2 | 10/2010 | Onishi |
|---|---|---|---|
| 9,804,027 | B2 | 10/2017 | Fish et al. |
| 10,139,278 | B2 | 11/2018 | Fish et al. |
| 10,422,693 | B2 | 9/2019 | Fish et al. |
| 10,732,039 | B2 | 8/2020 | Fish et al. |
| 11,231,320 | B2 | 1/2022 | Fish et al. |
| 2007/0182960 | A1 | 8/2007 | Jayaraman |
| 2008/0004513 | A1 | 1/2008 | Walker et al. |
| 2008/0138088 | A1* | 6/2008 | Welch ................ H04B 10/506 398/183 |
| 2013/0208753 | A1 | 8/2013 | Van et al. |
| 2014/0209798 | A1 | 7/2014 | Woodward et al. |
| 2016/0091368 | A1 | 3/2016 | Fish et al. |
| 2016/0266322 | A1 | 9/2016 | Epitaux et al. |
| 2018/0045566 | A1 | 2/2018 | Fish et al. |
| 2019/0049298 | A1 | 2/2019 | Fish et al. |
| 2019/0391011 | A1 | 12/2019 | Fish et al. |
| 2020/0340860 | A1 | 10/2020 | Fish et al. |

OTHER PUBLICATIONS

"U.S. Appl. No. 14/865,318, Notice of Allowance dated Aug. 14, 2017", 5 pgs.
"U.S. Appl. No. 14/865,318, Response filed Jul. 24, 2017 to Non Final Office Action dated Jun. 9, 2017", 6 pgs.
"U.S. Appl. No. 15/723,409, Corrected Notice of Allowability dated Oct. 11, 2018", 7 pgs.
"U.S. Appl. No. 15/723,409, Notice of Allowance dated Sep. 14, 2018", 10 pgs.
"U.S. Appl. No. 16/162,489, Non Final Office Action dated Jan. 11, 2019", 8 pgs.
"U.S. Appl. No. 16/162,489, Notice of Allowance dated May 13, 2019", 9 pgs.
"U.S. Appl. No. 16/162,489, Response filed Apr. 11, 2019 to Non Final Office Action dated Jan. 11, 2019", 12 pgs.
"U.S. Appl. No. 16/545,362, Non Final Office Action dated Dec. 11, 2019", 8 pgs.
"U.S. Appl. No. 16/545,362, Notice of Allowance dated Apr. 1, 2020", 7 pgs.
"U.S. Appl. No. 16/545,362, Preliminary Amendment filed Aug. 29, 2019", 6 pgs.
"U.S. Appl. No. 16/545,362, Response filed Mar. 11, 2020 to Non Final Office Action dated Dec. 11, 2019", 10 pgs.
"U.S. Appl. No. 16/927,290, Non Final Office Action dated Jun. 9, 2021", 8 pgs.
"U.S. Appl. No. 16/927,290, Notice of Allowance dated Sep. 17, 2021", 8 pgs.
"U.S. Appl. No. 16/927,290, Response filed Sep. 8, 2021 to Non Final Office Action dated Jun. 9, 2021", 10 pgs.
"European Application Serial No. 15002775.3, Communication Pursuant to Article 94(3) EPC Nov. 16, 2018", 6 pgs.
"European Application Serial No. 15002775.3, Extended European Search Report dated Mar. 9, 2016", 9 pgs.
"European Application Serial No. 15002775.3, Office Action dated Mar. 10, 2016", 1 pg.
"European Application Serial No. 15002775.3, Response filed Mar. 15, 2019 to Communication Pursuant to Article 94(3) EPC Nov. 16, 2018", 7 pgs.
"European Application Serial No. 15002775.3, Response filed Oct. 5, 2016", 19 pgs.
"European Application Serial No. 19200099.0, Extended European Search Report dated Feb. 18, 2020", 13 pgs.
"European Application Serial No. 19200099.0, Response filed Sep. 18, 2020 to Extended European Search Report dated Feb. 18, 2020", 18 pgs.
Hattasan, N., et al., "Integrated thin-film GaSb-based Fabry-Perot lasers: towards a fully integrated spectrometer on a SOI waveguide circuit", Medical Imaging 2002: PACS and Integrated Medical Information Systems: Design and Evaluation, vol. 8631, (Feb. 4, 2013), 863114-1-863114-8.
Koch, B R, et al., "Integrated Silicon Photonic Laser Sources for Telecom and Datacom", Optical Fiber Communication Conference and Exposition and the National Fiber Optic Engineers Conference (OFC/NFOEC), (Mar. 17, 2013), 1-3.
Koch, Brian R, et al., "Heterogeneously integrated lasers on silicon", Optomechatronic Micro/Nano Devices and Components III : Oct. 8-10, 2007, Lausanne, Switzerland; [Proceedings of SPIE, ISSN 0277-786X], SPIE, Bellingham, Wash, vol. 9002, (Feb. 27, 2014), 90020U-1-90020U-8.
Roel, Baets, et al., "Spectroscopy-on-chip applications of silicon photonics", Medical Imaging 2002: PACS and Integrated Medical Information Systems: Design and Evaluation, vol. 8627, (Mar. 6, 2013), 86270I-1-86270I-10.
Ryckeboer, E, et al., "Silicon-on-insulator spectrometers with integrated GaInAsSb photodiodes for wide-band spectroscopy from 1510 to 2300 nm References and linksStudy of evanescently-coupled and grating-assisted GaInAsSb photodiodes integrated on a silicon photonic chip", IEEE Photon. Technol. Lett. IEEE J. Sel. Top. Quantum Electron. Appl. Spectrosc. Opt. Express IEEE J. Sel. Top. Quantum Electron. J. Lightwave Technol. J. Lightwave Technol. Semicond. Sci. Technol, [Online] retrieved from the internet:http://photonics.intec.ugent.be/download/pub_3138.pdf, (Jan. 1, 2012), 463-487.
Soref, R, "Towards Silicon-based Longwave Integrated Optoelectronics (LIO)", SPIE, PO Box 10 Bellingham WA, 98227-0010, USA, vol. 6898, (2008), 1-13.

* cited by examiner

HETEROGENEOUS SPECTROSCOPIC TRANSCEIVING PHOTONIC INTEGRATED CIRCUIT SENSOR

CROSS-REFERENCE TO RELATED APPLICATIONS

This application is a continuation of U.S. application Ser. No. 16/927,290, filed Jul. 13, 2020, which is a continuation of U.S. application Ser. No. 16/545,362, filed Aug. 20, 2019, which is a continuation of U.S. application Ser. No. 16/162,489, filed Oct. 17, 2018, which is a continuation of U.S. application Ser. No. 15/723,409, filed Oct. 3, 2017, which is a continuation of U.S. application Ser. No. 14/865,318, filed Sep. 25, 2015, which claims the benefit of priority to U.S. Provisional Patent Application Ser. No. 62/056,765, filed Sep. 29, 2014, all of which are hereby incorporated herein by reference in their entirety.

FIELD

Embodiments generally pertain to optical devices and more specifically to optical sensing components included in photonic integrated circuits.

BACKGROUND

Spectroscopic sensing processes for chemical analysis of substances and noninvasive measurements of blood constituents has long been proposed for detection and health monitoring. Laser based systems provide substantially higher signal to noise; however due to the large size and cost of laser based spectroscopic systems, they are not routinely deployed.

Spectroscopic systems that are based on discrete laser sources and based on the limited wavelength range of semiconductor sources are too large and too expensive for several uses, including spectroscopic sensing via wearable health monitoring devices. Spectroscopic systems utilizing broadband sources also utilize a spectrometer on the detector side, which increases system size and weight and decreases the efficiency of light collection.

BRIEF DESCRIPTION OF THE DRAWINGS

The following description includes discussions of figures having illustrations given by way of example of implementations and embodiments of the subject matter disclosed herein. The drawings should be understood by way of example, and not by way of limitation. As used herein, references to one or more "embodiments" are to be understood as describing a particular feature, structure, or characteristic included in at least one implementation of the disclosure. Thus, phrases such as "in one embodiment" or "in an alternate embodiment" appearing herein describe various embodiments and implementations of the disclosure, and do not necessarily all refer to the same embodiment. However, such phrases are also not necessarily mutually exclusive.

Descriptions of certain details and implementations follow, including a description of the figures, which may depict some or all of the embodiments described below, as well as a description of other potential embodiments or implementations of the concepts presented herein. An overview of embodiments is provided below, followed by a more detailed description with reference to the drawings.

DESCRIPTION

Embodiments of the disclosure describe optical sensing devices for photonic integrated circuits (PICs). Throughout this specification, several terms of art are used. These terms are to take on their ordinary meaning in the art from which they come, unless specifically defined herein or unless the context of their use would clearly suggest otherwise. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects of the disclosure.

Figure 1A:
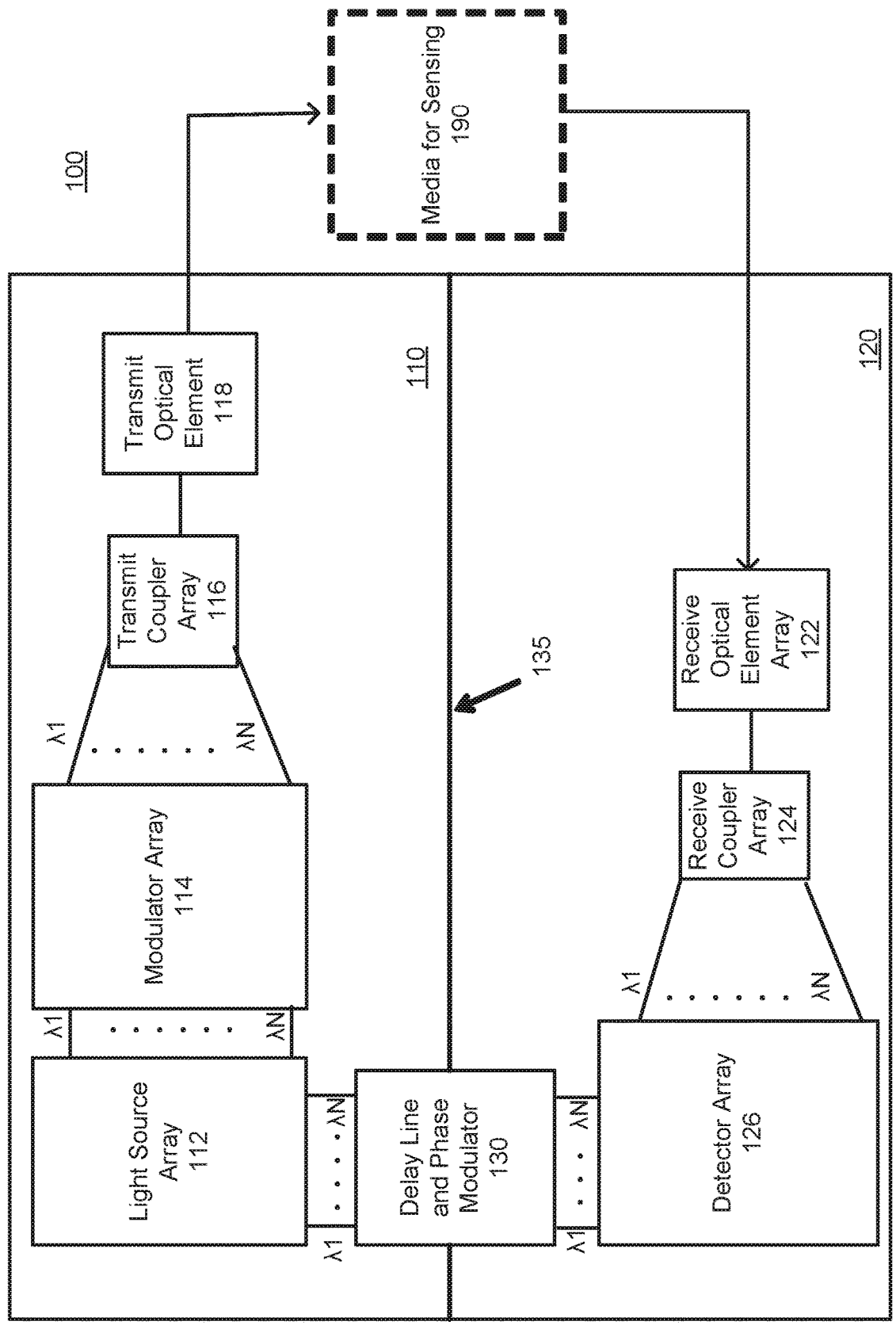
FIG. 1A-FIG. 1C illustrate components a photonic integrated circuit used for optical sensing in accordance with some embodiments.
Figure 1B:
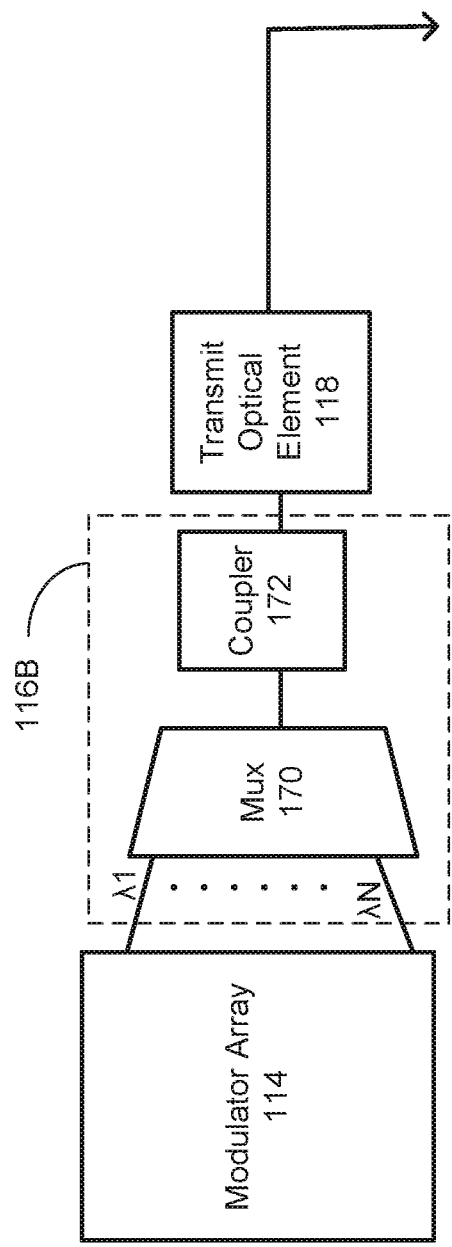
Figure 1C:
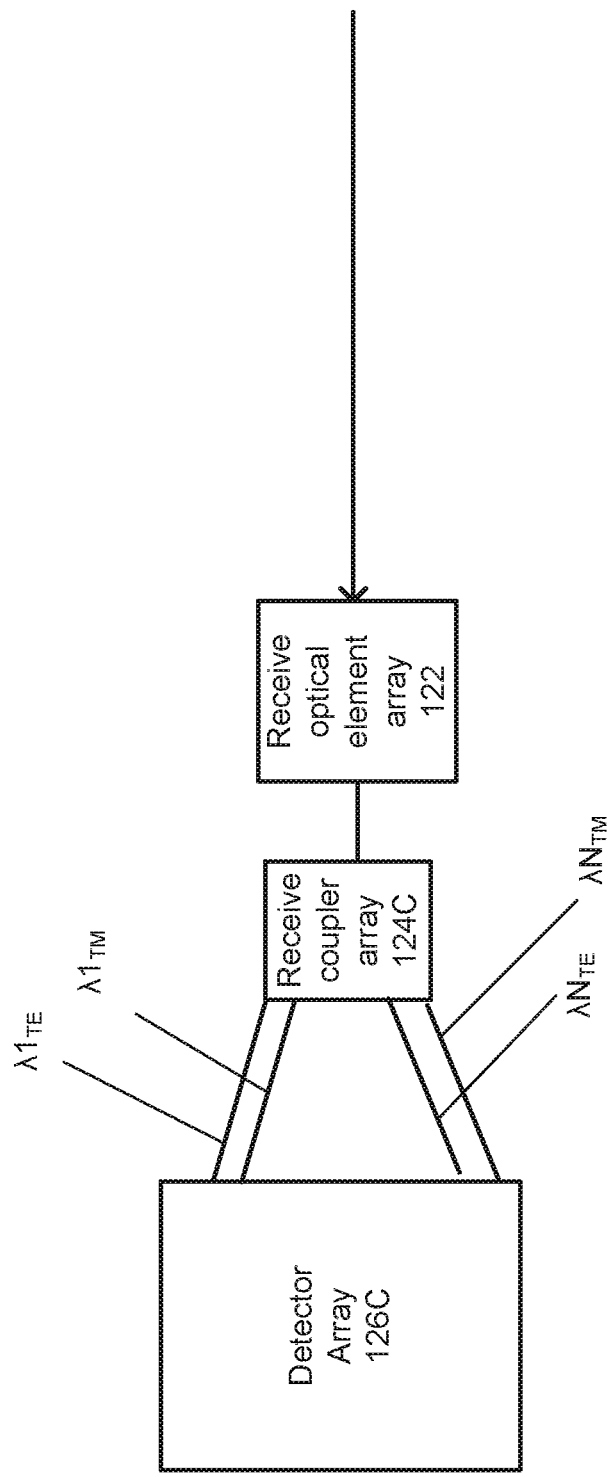

FIG. 1A-FIG. 1C illustrate components a photonic integrated circuit (PIC) used for optical sensing in accordance with some embodiments. A PIC 100 is illustrated as an optical transceiver device and is shown to include several components on the transmitter portion 110 and the receiver portion 120 of the PIC. As described in further detail below, the transmitter portion 110 of the PIC 100 is to emit light towards a media for sensing 190, while the receiver portion 120 of the PIC 100 is to receive light from (e.g., reflected from or transmitted through) the media for sensing 190.

The transmitter portion 110 is shown to include a light source array 112, a modulator array 114, a transmit coupler array/aperture 116, and a transmission optical element 118. In some embodiments the light source array 112 may comprise a plurality of narrow band light sources, such as a plurality of lasers or a plurality of high power light emitting diode (LED) light sources. In some embodiments, the light source array 112 may comprise tuning elements, such as a tunable filter, for tuning the output of the light source array 112 to emit over a wavelength range (in this embodiment, wavelengths $\lambda_1$-$\lambda_N$) significantly wider than a single semiconductor media.

The modulator array 114 of the transmitter portion 110 of the PIC 100 may be used to modulate the outputs of the light source array 110. By modulating the outputs of the light source array 110 (for example, at different frequencies), their individual contributions that reach one or more detectors (described in further detail below) can be determined by various techniques.

The modulated outputs of the light source array 112 are output from the PIC 100 via the transmit coupler array/aperture 116. In some embodiments, the transmit coupler array/aperture 116 comprises an array of optical couplers (e.g., one for each source) within an aperture. FIG. 1B illustrates an alternative embodiment of a transmit coupler array/aperture element 116B, wherein the modulated outputs of the modulator array 114 are received by an optical multiplexer 170, and the single output of the multiplexer is received by a single coupler 172.

Referring back to FIG. 1A, in this embodiment, the output of the transmit coupler array/aperture 116 is received by the optical element 118 prior to the light being received by the media for sensing 190. The optical element 118 may contain one or more elements for shaping the emitted light and directing the emitted light towards the media for sensing 190 (e.g., a lens, a grating, an emitting facet, etc.). In other embodiments, the optical element 118 may be external to the PIC.

The receiver portion 120 of the PIC 100 is shown to include a receiving optical element array 122, a receive coupler/array 124, and an array of detectors 126. The receiving optical element array 122 may be configured by element design and/or layout for receiving light transmitted through, reflected by, and/or scattered by the media for sensing 190. The receive coupler/array 124 may split (e.g., de-multiplex) the received light into individual wavelengths or wavelength groups.

The detector array 126 may be capable of detecting substantially all the wavelengths the light source array 112 (of the transmit portion 110 of the PIC 100)—i.e., able to emit and/or all the wavelengths of light to be received from the media for sensing 190; the receive optical element 122 may comprise a receive aperture that is substantially similar or larger than the aperture of the transmit coupler array/aperture 116 (of the transmit portion 110 of the PIC 100). In other embodiments, detector materials of different semiconductor substrates may be used to detect all the light wavelengths. Furthermore, in some embodiments, separate detectors may be used for different wavelengths, and a plurality of detectors, collecting apertures, and/or couplers may be used within the PIC 100.

Furthermore detecting weak scattered signals may be difficult in the presence of strong source signals. In this embodiment, optical/thermal/electrical isolation components 135 are utilized for preventing light from the light source array 112 from reaching the detector array 126 (i.e., other than through the receive optical element array 122). These structures may be constructed, for example, by using trenches and metallic boundaries in the substrate of the PIC 100.

The PIC 100 may be used for spectroscopic processes (e.g., determining aspects of an object based on the interaction of the object with electromagnetic radiation, such as light). For example, spectroscopic methods for noninvasive monitoring of blood constituents may benefit from techniques to resolve the scattering and/or absorption at different or specific depths (coherent tomography) and also phase modulation for removing "speckle" as well as measuring polarization rotation of scattered light. In this embodiment, a delay line and phase modulator 130 may be used to provide a delayed reference of the light source array 112 incident of the detectors 126. In some embodiments, the detectors 126 may comprise components for detecting the polarization components of the received light signals. FIG. 1C illustrates an embodiment wherein the receive coupler/array 124C comprises polarization splitting elements to split light by wavelength and by TE/TM polarization to be received by detector array 126C. In some embodiments, by tuning the wavelengths of the outputs of the light source array 112 in time (e.g. swept source), the effective "distance" of the reference beam can be modified without using moving parts.

Utilizing the PIC 100 for including both light emitter circuitry (e.g., the transmitter portion 110) and light sensing circuitry (e.g., the receiver portion 120), the size, weight, and power requirements of a spectrometer device may be reduced such that the device may be battery powered and compatible with mobile or wearable devices. Additionally, solutions utilizing separate sources and detectors may use an optical fiber bundle where the source light and scattered light could be emitted/collected in close proximity to each other. This fiber bundling and coupling adds additional size and cost for the device, and is not used for the PIC 100. However, in other embodiments, the transmitter portion 110 and the receiver portion 120 may be included in different PICs. Furthermore, by using lasers for the light source array 112, power efficiency is increased (compared to an interferometer making use of broadband light) and light filtering elements may not need to be included in the receiver portion 120 of the PIC 100.

The PIC 100 may be formed of any semiconductor material suitable for photonic devices and photonic operation, such as silicon-based materials (e.g., silicon (Si), silicon nitride (SiN)); non-silicon material such as III-V material, magneto-optic material, or crystal substrate material; or a combination of silicon and non-silicon material (alternatively referred to as "heterogeneous material"). The PIC 100 may include one or more optical devices controlled and/or driven, at least in part, by control and/or driver circuitry included in one or more electronic components. The electronic components may include one or more application specific integrated circuits (ASICs), and may be formed of any semiconductor material suitable for electronic devices and electronic operation, such as Si.

At least some of the components of the PIC 100 can comprise heterogeneous material. In some embodiments, waveguides interconnecting the optical components of PIC 100 may be formed in an SOI substrate. The light source array 112 may comprise a plurality of heterogeneous lasers, each laser formed from silicon material of the SOI substrate and to emit an output wavelength comprising an infrared wavelength. Each of these lasers may comprise a resonant cavity included in one of the plurality of waveguides, and a gain material comprising a non-silicon material and adiabatically coupled to the respective waveguide. In some embodiments, the light source array may include lasers having different non-silicon gain materials.

The PIC 100 can be closely integrated with electronics, for example by mounting an electrical chip and photonic chip to the same board, or fabricating electronics and photonics on the same chip. Due to close integration, radio frequency (RF) signals may be transmitted efficiently between electronic circuits and photonic transmitters and receivers. RF modulation of light and phase sensitive detection may be used to improve the signal to noise of the measurement and measure the optical delay the signal has passed through, enabling extraction of the scattering and absorption properties of the medium being measured (without prior assumptions of either of the properties).

Figure 2A:
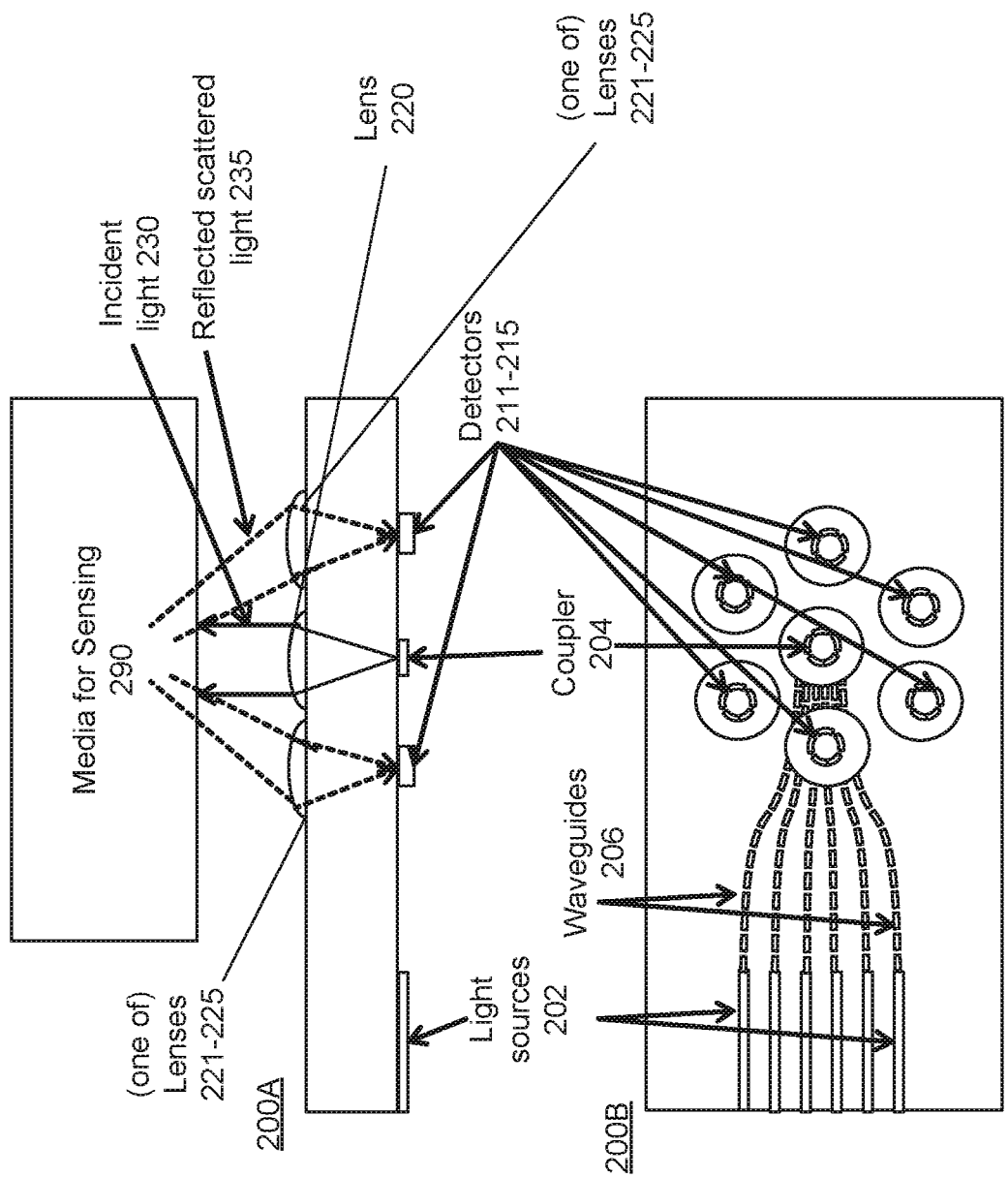
FIG. 2A-FIG. 2B illustrate cross-section and top-down views of components of photonic integrated circuits used for optical sensing in accordance with some embodiments.
Figure 2B:
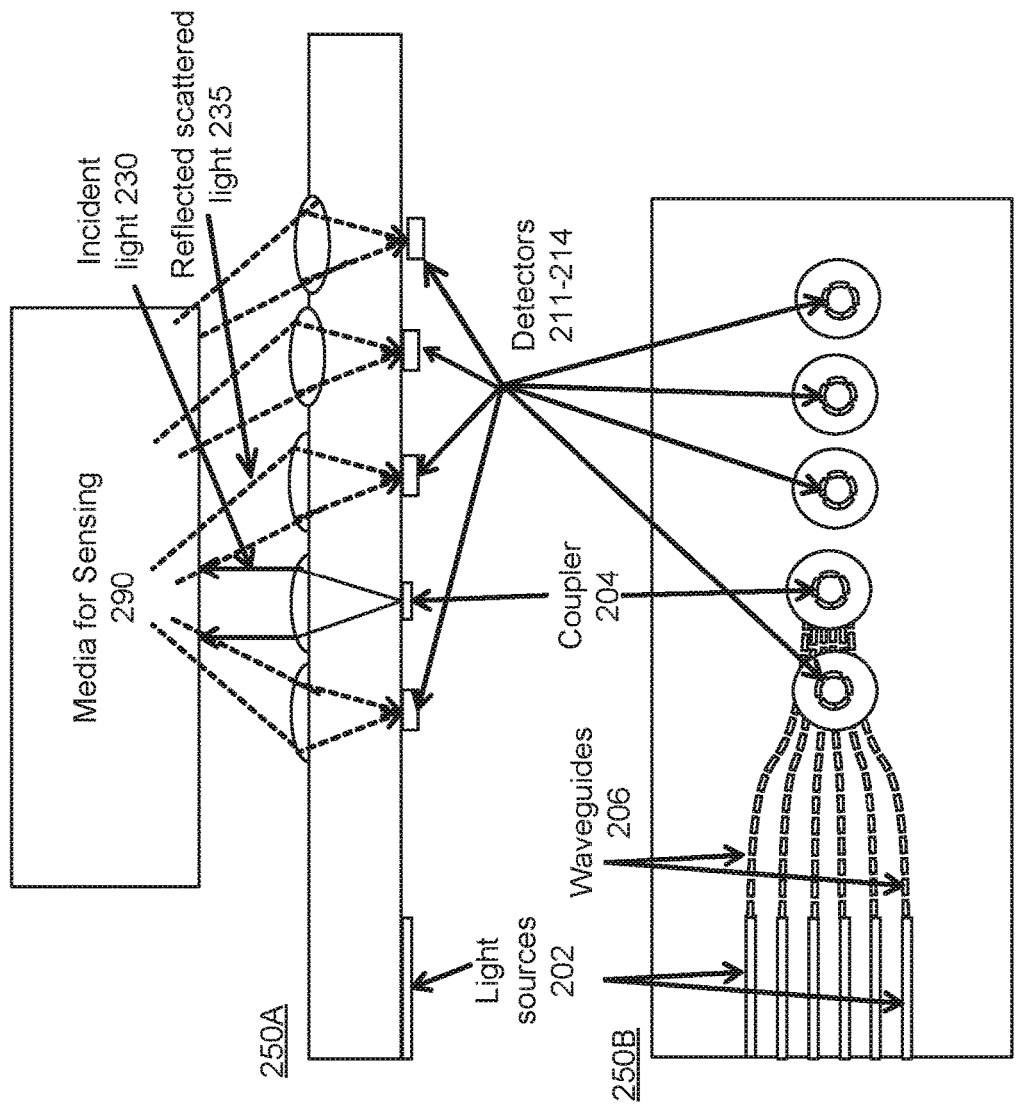

FIG. 2A-FIG. 2B illustrate cross-section and top-down views of components of PICs used for optical sensing in accordance with some embodiments. A PIC is shown in a cross sectional view 200A and top-down view 200B to include an array of light sources 202. Light from the array of light sources 202 is received by an output coupler 204 via a plurality of waveguides 206. In some embodiments, the array of light sources 202 are configured to emit a plurality of wavelength ranges. The PIC 200 is further shown to include a plurality of detectors 211-215 (each of which, in this embodiment, includes collection apertures).

As shown in this embodiment, the PIC 200 includes lenses 220-225. The lens 220 is used for shaping the emitted light from the array of light sources 202 (via the coupler 204) and directing the emitted light towards the media for sensing 290. The lenses 221-225 are used for shaping the light reflected from the media for sensing 290 and directing the reflected light towards the detectors 211-215, respectively. In this embodiment, the detectors 211-215 are shown to be surrounding the coupler 204 and are shown to be placed (roughly) equidistant from the coupler 204.

The PIC 200 is shown to emit incident light 230 and receive reflected scattered light 235 (reflected/scattered by the media for sensing 290) normal to a surface of the PIC 200. Light directing elements such as gratings may be used to direct the light 230 and 235 normal to the surface of the PIC 200 to reduce the size of the device.

Furthermore, scanning the incident light 230 parallel to the surface of the media for sensing 290 may remove noise associated with movement of the media. In some embodiments, elements for scanning the input to the transmit coupler 204 may be used to modify the angle of emission of the incident light 230 (e.g., a sweeper incident on a grating coupler or curved 45 degree mirror). In these embodiments, 2D scanning may be facilitated, for example, by splitting the source signal in two sweepers and combining them in polarization combining coupler or using two orthogonal output couplers.

Other embodiments for scanning the incident light 230 parallel to the surface of the media for sensing 290 may use lenses that have dynamic focal and tilt properties (e.g., liquid lenses). In these embodiments, the lens properties can be adjusted to compensate for dispersive properties of a grating coupler or to enhance them for scanning the output beam angle.

In some embodiments, the multiple detectors 211-215 may be used to remove speckle by collecting the reflected scattered light 235 at different angles, an approach referred to herein as angular compounding. Additionally, speckle may be removed by using the multiple lenses 221-225 to collect light emitted from the media for sensing 290 at different angles The position of the detectors may also vary based on the intended use of the device. A PIC is shown in a cross sectional view 250A and a top-down view 250B of FIG. 2B to include the same components as the PIC 200; however, in this embodiment, some of the collection apertures and detectors 211-214 of the PIC 250 are located at different distances from the source of the incident light (i.e., the coupler 204). This layout of the detectors 211-214 may aid in the acquisition of scattering and absorption properties of the medium for sensing 290.

Figure 3:
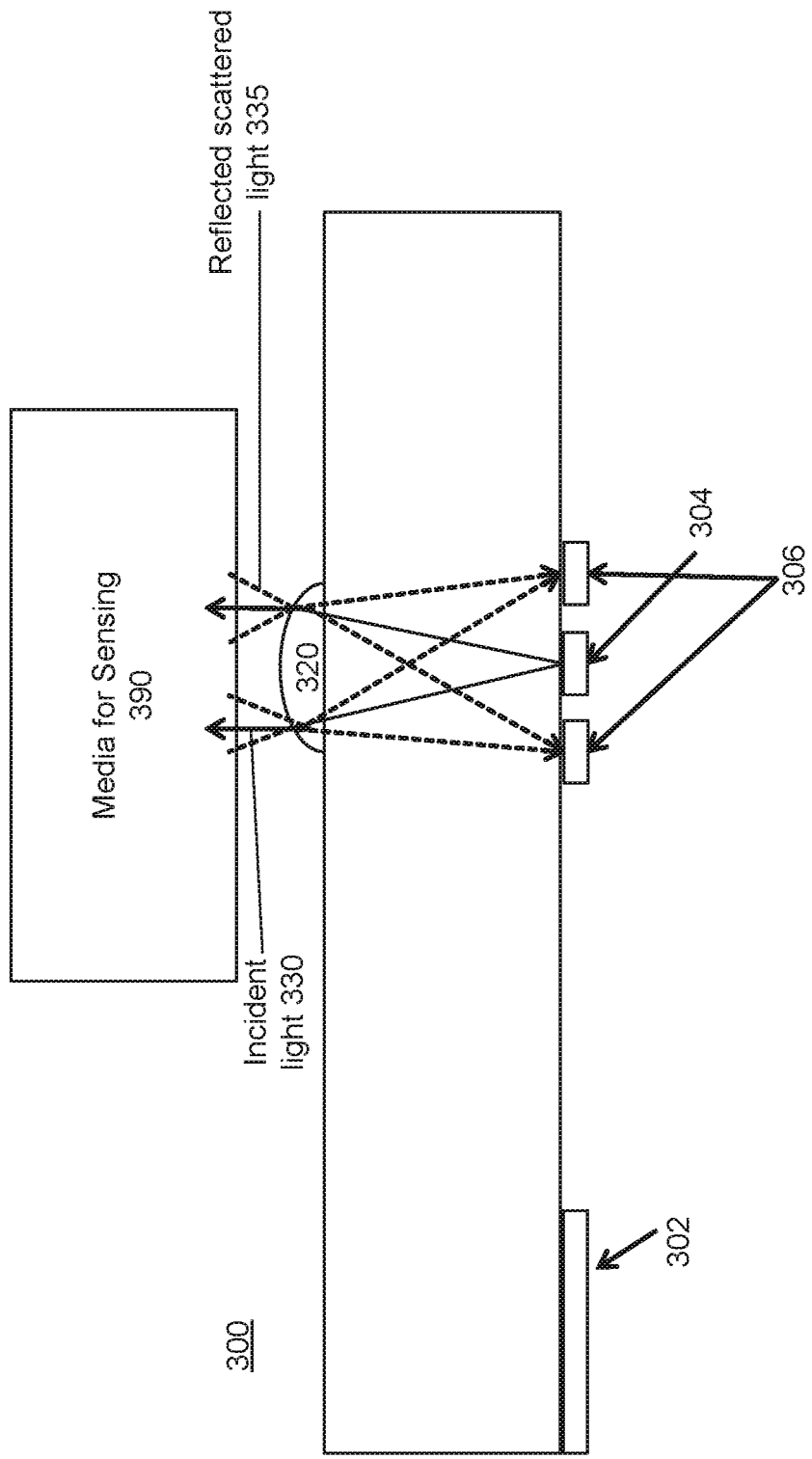
FIG. 3 illustrates a cross-section view of components of a photonic integrated circuit used for optical sensing in accordance with some embodiments.

FIG. 3 illustrates a cross-sectional view of components of a PIC used for optical sensing in accordance with some embodiments. A PIC 300 is shown in a cross sectional view to include one or more light sources 302. Light from the one or more light sources 302 is received by a grating 304 to direct light towards a media for sensing 390. The PIC 300 is further shown to include gratings 306 associated with a plurality of detectors to detect light reflected from the media for sensing 390.

In this embodiment, scattered or reflected light from the media for sensing 390 may be collected by the same aperture and coupler from which the light source was coupled out of the PIC—illustrated in this embodiment as lens 320. The gratings 304 and 306 are placed under the lens 320 (i.e., a single aperture) in order to accomplish one or more technical effects, including covering several different spectral ranges that cannot be covered by a single grating, collecting light at several gratings in order to average out speckle in a interferometric measurement, and/or improving signal-to-noise ratio. Furthermore, in other embodiments, light may be emitted from a light source and collected by a collector via a same grating.

Figure 4:
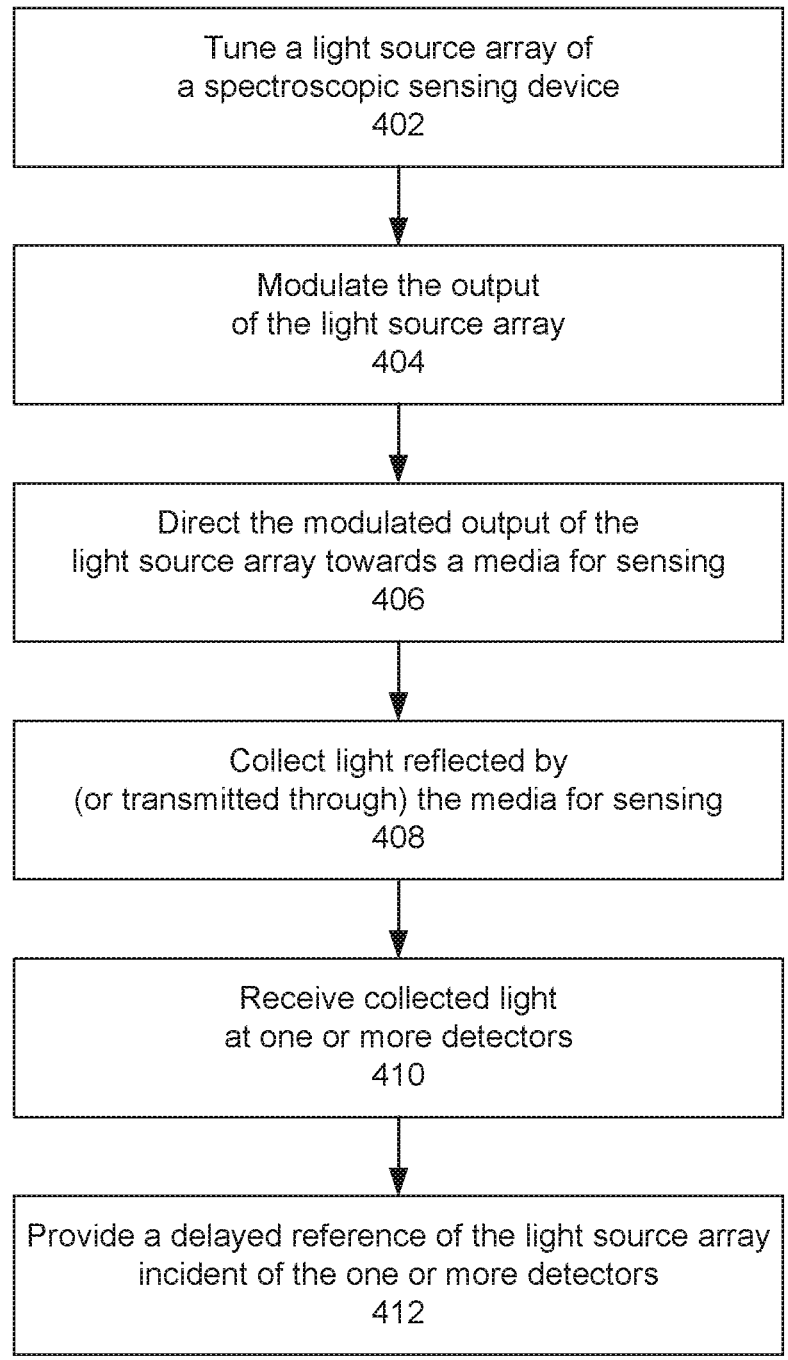
FIG. 4 is a flow diagram of a process for operating an optical sensing device in accordance with some embodiments.

FIG. 4 is a flow diagram of a process for operating an optical sensing device in accordance with some embodiments. Flow diagrams as illustrated herein provide examples of sequences of various process actions. Although the actions are shown in a particular sequence or order, unless otherwise specified, the order of the actions can be modified. Thus, the described and illustrated implementations should be understood only as examples. The illustrated actions can be performed in a different order, and some actions can be performed in parallel. Additionally, one or more actions can be omitted in various embodiments; thus, not all actions are required in every implementation. Other process flows are possible.

A process 400 is illustrated as including an operation that is executed to tune a light source array of a spectroscopic sensing device (shown as block 402). In some embodiments, the light source array may comprise tuning elements, such as a tunable filter, for tuning the output of the light source array to emit over one or more wavelength ranges (e.g., infrared wavelength ranges). In some embodiments, by tuning the wavelengths of the outputs of the light source array in time (e.g. swept source), the effective "distance" of the reference beam can be modified without using moving parts.

An operation is executed to modulate the outputs of the light source array (shown as block 404). In some embodiments, the outputs of the light source array may be modulated at different carrier frequencies such that their individual contributions are more easily detectable.

The modulated output of the light source array is then directed towards a media for sensing (shown as block 406). Spectroscopic sensing devices are often used for detecting characteristics of organic matter such as human tissue, but these devices may also be used for any other objects. Light either reflected by or transmitted through the media for sensing is collected by one or more collector apertures (shown as block 408) and subsequently received by one or more detectors (shown as block 410). A variety of detection process can be used to detect characteristics of the media for sensing. For example, where coherent detection is utilized, the light collected from the media for sensing is combined with a component of light from one or more of the light sources that has not been coupled off of the PIC.

A delayed reference of the light source array incident of the one or more detectors is provided to the light source array (shown as block 412). This may be used for resolving the scattering and/or absorption at different or specific depths (e.g., coherent tomography) and also phase modulation for removing "speckle" as well as measuring polarization rotation of scattered light (where the light collected has undergone scattering within the media for sensing). These operations for monitoring the power of the light sources to provide a reference for the received spectroscopic signal may be useful as semiconductor sources degrade in efficiency over time (as opposed to light detectors, which do not degrade).

Figure 5:
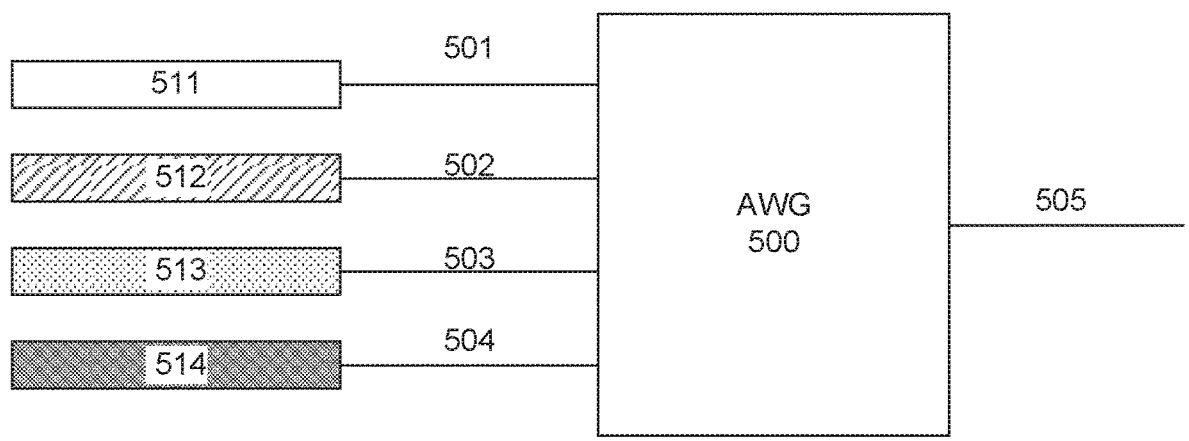
FIG. 5 is an illustration of an arrayed waveguide grating used for an optical sensing device in accordance with some embodiments.
Figure 5:
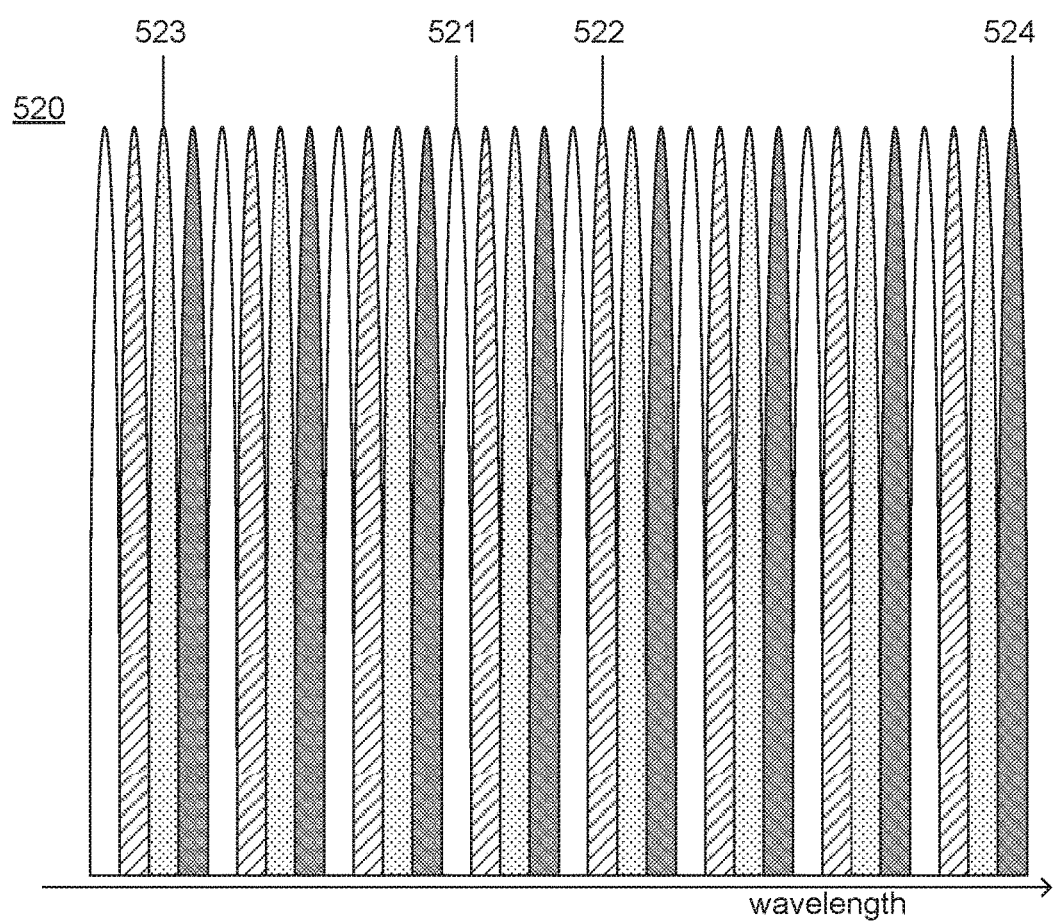

FIG. 5 is an illustration of an arrayed waveguide grating (AWG) used for an optical sensing device in accordance with some embodiments. An AWG 500 is shown to comprise a plurality of ports 501-504 and a port 505. When used to multiplex or combine light signals, input signals received via the ports 501-504 are combined and output via the port 505 (in this use case, the ports 501-504 are coupled to light sources). When used to de-multiplex or separate light signals, an input signal receive via the port 505 is split into components by wavelength, which are then each output via the ports 501-504 (in this use case, the ports 501-504 are coupled to detectors). In both of these use cases, the relationship between channel wavelength and the ports 501-504 may be described as the free spectral range (FSR) of the AWG 500. In other words, an optical channel (e.g., comprising a narrow band of wavelengths) is coupled between the port 505 and one of the ports 501-504. The AWG 500 may comprise a cyclic AWG that comprises a periodicity that corresponds with the FSR.

In this embodiment, the ports 501-504 of the AWG 500 are shown to be coupled to light sources 511-514, respectively. In embodiments where the AWG 500 comprises a cyclic AWG, it may be used to multiplex or de-multiplex several wavelengths with a wide span by locking the wavelengths to passband channels of the AWG 500.

In some embodiments, the AWG 500 is used multiplex different spectral lines which are far apart (shown as spectral lines 521-524 of a wavelength grid 520), especially if the width of the spectral line is comparable to the FSR of the AWG. Likewise, the AWG 500 may be used as a de-multiplexer to separate light collected from a media for sensing by wavelength channel.

Reference throughout the foregoing specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout the specification are not necessarily all referring to the same embodiment. Furthermore, the particular features, structures, or characteristics can be combined in any suitable manner in one or more embodiments. In addition, it is to be appreciated that the figures provided are for explanation purposes to persons ordinarily skilled in the art and that the drawings are not necessarily drawn to scale. It is to be understood that the various regions, layers, and structures represented in the figures can vary in size and dimensions.

The above described embodiments can comprise silicon on insulator (SOI) or silicon-based (e.g., silicon nitride (SiN)) devices, or can comprise devices formed from both silicon and a non-silicon material. Said non-silicon material (alternatively referred to as "heterogeneous material") can comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V-based materials can be significantly higher than in silicon-based materials, as electron speed in III-V semiconductors is much faster than that in silicon semiconductors. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in heterogeneous optical devices; in some embodiments, said heterogeneous devices utilize low-loss heterogeneous optical waveguide transitions between the devices' heterogeneous and silicon-only waveguides.

Magneto-optic materials allow heterogeneous PICs to operate based on the magneto-optic (MO) effect. Such devices can utilize the Faraday effect, in which the magnetic field associated with an electrical signal modulates an optical beam, offering high bandwidth modulation, and rotates the electric field of the optical mode, enabling optical isolators. Said magneto-optic materials can comprise, for example, materials such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials can comprise, for example, lithium niobate ($LiNbO_3$) or lithium tantalate ($LiTaO_3$).

In the foregoing detailed description, the method and apparatus of the present subject matter have been described with reference to specific exemplary embodiments thereof. It will, however, be evident that various modifications and changes can be made thereto without departing from the broader spirit and scope of the present inventive subject matter. The present specification and figures are accordingly to be regarded as illustrative rather than restrictive.

In some embodiments, a PIC may comprise a plurality of waveguides formed in a silicon on insulator (SOI) substrate, and a plurality of heterogeneous lasers, each laser formed from a silicon material of the SOI substrate and to emit an output wavelength comprising an infrared wavelength. Each of these lasers may comprise a resonant cavity included in one of the plurality of waveguides, and a gain material comprising a non-silicon material and adiabatically coupled to the respective waveguide. A light directing element may direct outputs of the plurality of heterogeneous lasers from the PIC towards an object, and one or more detectors may detect light from the plurality of heterogeneous lasers reflected from or transmitted through the object.

In some embodiments, the one or more detectors and the light directing element are both included in the PIC. In some embodiments, the PIC further comprises one or more emission apertures to emit light from the plurality of heterogeneous lasers, and one or more collection apertures to receive light for the one or more detectors. In some embodiments, a quantity of the plurality of collection apertures is greater than a quantity of the one or more emission apertures. In some embodiments, the one or more emission apertures and the one or more collection apertures comprise a same single aperture. In some embodiments, at least two of the plurality of collection apertures are different distances from the one or more emission apertures.

In some embodiments, the light directing element comprises an edge emitting facet to emit light from an edge of the PIC, and a tuning mirror to direct light from the edge emitting facet towards the object. In some embodiments, the light directing element comprises a grating. In some embodiments, the light directing element is to direct the outputs of the plurality of heterogeneous lasers normal to a surface of the PIC. In some embodiments, the plurality of heterogeneous lasers are configured to emit a plurality of wavelength ranges, and the one or more detectors comprise a detector for each wavelength range.

In some embodiments, the plurality of heterogeneous lasers comprises a first laser having a gain material comprising a first non-silicon material, and a second laser having a gain material comprising a second non-silicon material different than the first non-silicon material.

In some embodiments, the PIC further comprises one or more modulators to modulate intensities of the outputs of the plurality of heterogeneous, the intensities to be modulated with a carrier frequency.

In some embodiments, the light collected from the object is coupled into a waveguide mode. In some embodiments, the light collected from the object is to be combined with a component of light from one or more of the heterogeneous lasers that has not been coupled off of the PIC.

Some embodiments described a spectroscopic sensing device comprising a light source array comprising a plurality of heterogeneous lasers, each laser formed from a silicon material and a non-silicon material, control circuitry to generate control signals to tune the light source array to emit output optical signals comprising infrared wavelengths over one or more wavelength ranges, and modulate the output signals of the light source array, a light directing element to direct the modulated output signals of the light source array towards an object, and one or more detectors to detect light reflected from or transmitted through the object.

In some embodiments, the outputs of the light source array are modulated at different carrier frequencies. In some embodiments, the light directing element is to direct the modulated output signals of the light source array normal to a surface of the device. In some embodiments, the object comprises human tissue. In some embodiments, the spectroscopic device further comprises a wearable housing to include the light source array, the control circuitry, the light directing element, and the one or more detectors.

The invention claimed is:

1. A method of processing light using a photonic integrated circuit, the method comprising:
   coupling light into a waveguide formed in the photonic integrated circuit, the light being generated at a wavelength by a light source;
   directing the light towards an object using a transmit optical element;
   coupling the light to a delay line that modifies a phase of the light to form a delayed reference light;
   directing returned light that is returned from the object onto a detector; and
   analyzing, using the detector, a signal from the returned light and the delayed reference light.

2. The method of claim 1, wherein the light source is integrated in the photonic integrated circuit.

3. The method of claim 1, wherein the detector is coupled to a grating to receive, from the transmit optical element, the returned light that is returned from the object.

4. The method of claim 3, wherein the grating is located on the photonic integrated circuit near an additional grating that directs the light towards the transmit optical element.

5. The method of claim 1, wherein a grating transmits the light towards the transmit optical element and receives the returned light from the transmit optical element.

6. The method of claim 1, wherein a grating is coupled to the detector that receives the returned light that is returned from the object.

7. The method of claim 1, wherein the light source is a tunable light source.

8. The method of claim 7, wherein the light is generated by the tunable light source at a plurality of wavelengths.

9. The method of claim 7, wherein the light source comprises a light emitting diode and a tunable filter.

10. The method of claim 7, wherein the light source comprises a tunable laser.

11. The method of claim 1, further comprising:
    modulating the light from the light source with modulation frequencies that are different from one another.

12. A photonic integrated circuit to process light, the photonic integrated circuit comprising:
    a waveguide formed in the photonic integrated circuit, the waveguide to propagate light generated at wavelength by a light source;
    a transmit optical element to direct the light towards an object;
    a delay line that modifies a phase of the light to form a delayed reference light; and
    a detector to detect the delayed reference light and returned light that is returned from the object and to analyze a signal from the returned light and the delayed reference light.

13. The photonic integrated circuit of claim 12, wherein the light source is integrated in the photonic integrated circuit.

14. The photonic integrated circuit of claim 12, further comprising:
    a grating to receive, from the transmit optical element, the returned light that is returned from the object.

15. The photonic integrated circuit of claim 14, wherein the grating is located in the photonic integrated circuit near an additional grating that directs the light towards the transmit optical element.

16. The photonic integrated circuit of claim 12, wherein a grating transmits the light towards the transmit optical element and receives the returned light from the transmit optical element.

17. The photonic integrated circuit of claim 12, wherein the light source is a tunable light source.

18. The photonic integrated circuit of claim 17, wherein the light source comprises a light emitting diode and a tunable filter.

19. The photonic integrated circuit of claim 17, wherein the light source comprises a tunable laser.

20. The photonic integrated circuit of claim 12, further comprising a modulator to modulate the light from the light source with modulation frequencies that are different from one another.

* * * * *